United States Patent
Lakoduk et al.

(10) Patent No.: US 7,881,074 B2
(45) Date of Patent: Feb. 1, 2011

(54) BLANKING PANEL

(75) Inventors: Harold D. Lakoduk, Anoka, MN (US); Trent T. Jones, White Bear Lake, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 793 days.

(21) Appl. No.: 11/761,919

(22) Filed: Jun. 12, 2007

(65) Prior Publication Data

US 2008/0310126 A1    Dec. 18, 2008

(51) Int. Cl.
H05K 7/02 (2006.01)
H05K 7/04 (2006.01)

(52) U.S. Cl. .................. 361/810; 361/807

(58) Field of Classification Search .......... 361/810, 361/807, 784, 796, 683–684, 686, 747–748, 361/600, 752, 759, 800–801; 211/41.1
See application file for complete search history.

(56) References Cited

U.S. PATENT DOCUMENTS 6,682,282 B2 *  1/2004  Allen ................. 411/353
6,891,727 B2 *  5/2005  Dittus et al. ............. 361/724
7,506,768 B2 *  3/2009  Rassmussen et al. ........ 211/26
7,699,279 B2 *  4/2010  Chen et al. ............ 248/220.41

OTHER PUBLICATIONS

"Product Data Sheet—Snap-In Filler Panels", *Chatsworth Products, Inc.*, www.chatsworth.com,(undated; but published at least before Jun. 12, 2007),1 page.
"J1514A—HP Filler Panels, pack of 6, quartz / J4387A—HP Filler Panels, pack of 6, graphite—Technical Data", *Hewlett-Packard*, (undated; but published at least before Jun. 12, 2007),1 page.

* cited by examiner

*Primary Examiner*—Hung S Bui
(74) *Attorney, Agent, or Firm*—Greenberg Traurig, LLP

(57) ABSTRACT

A blanking panel includes a main body extending from a first end to a second end and adapted to cover a rack having at least two posts, a fastener portion at the end of each of the first and the second ends, and an alignment member at the end of each of the first end and the second end, the alignment feature including a first pin and a second, removable pin such that the main body can be alternatively attached to a square hole with the removable pin intact, or attached to a round hole with the removable pin removed and the first pin extending through the hole.

11 Claims, 5 Drawing Sheets

BLANKING PANEL

FIELD OF THE INVENTION

This invention relates to the field of enclosure racks, and more specifically to blanking panel for an enclosure rack.

BACKGROUND

Enclosure racks typically include space for mounting equipment. When there is a space in the rack without equipment it is desirable to place a blanking panel to cover the space. This is for both aesthetic reasons and to provide better airflow through the components on the rack for cooling purposes. There is a need for an easier to use and mount blanking panel.

SUMMARY

A blanking panel includes a main body extending from a first end to a second end. There is an alignment member at the end of each of the first end and the second end. The alignment member includes a first pin and a second, removable pin such that the main body can be alternatively attached to a square hole with the removable pin intact, or attached to a round hole with the removable pin removed and the first pin extending through the hole.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the scope of the present invention. Therefore, the following detailed description is not to be taken in a limiting sense, and the scope of the present invention is defined by the appended claims and their equivalents.

Figure 1:
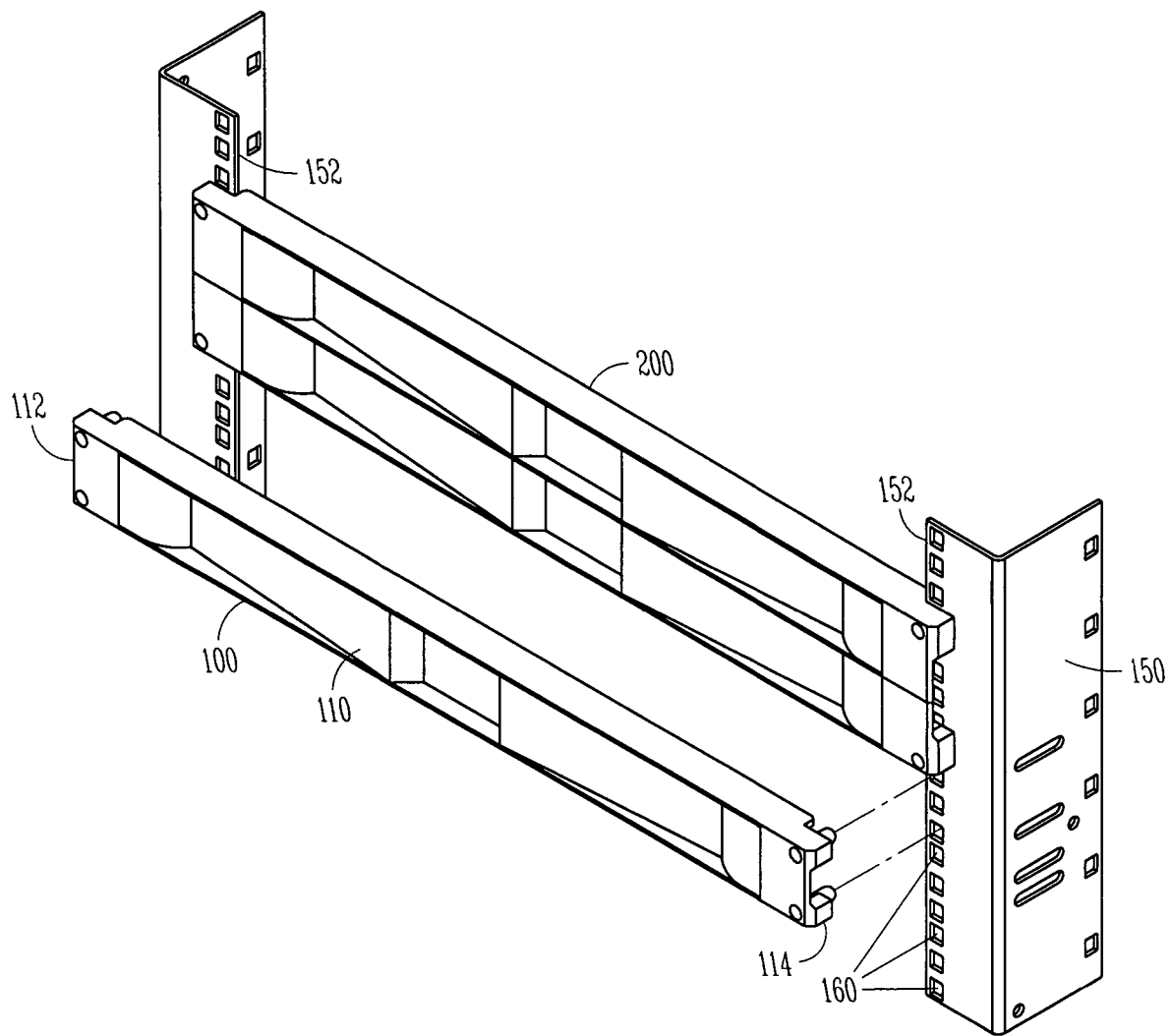
FIG. 1 shows a perspective view of blanking panels being mounted to a rack having square holes, in accordance with one embodiment.

FIG. 1 shows a perspective view of blanking panels 100 and 200 being mounted to a rack 150 having square holes 160, in accordance with one embodiment. Blanking panels 100, 200 provide a cover for a gap on rack 150 where there is no equipment mounted. Rack 150 is a standard 19-inch rack as used in the industry. However, some embodiments of the present system apply to racks having any dimensions. Blanking panels 100 and 200 are similar except that blanking panel 100 has a 1 U height and blanking panel 200 has a 2 U height. Blanking panels 100 and 200 are used to cover the gaps in rack 150 so as to provide better airflow in the rack, since air cannot escape through the covered gap, and also for aesthetic reasons.

The following discussion will focus on blanking panel 100, but it is understood that the same discussion also applies to blanking panel 200.

Figure 3:
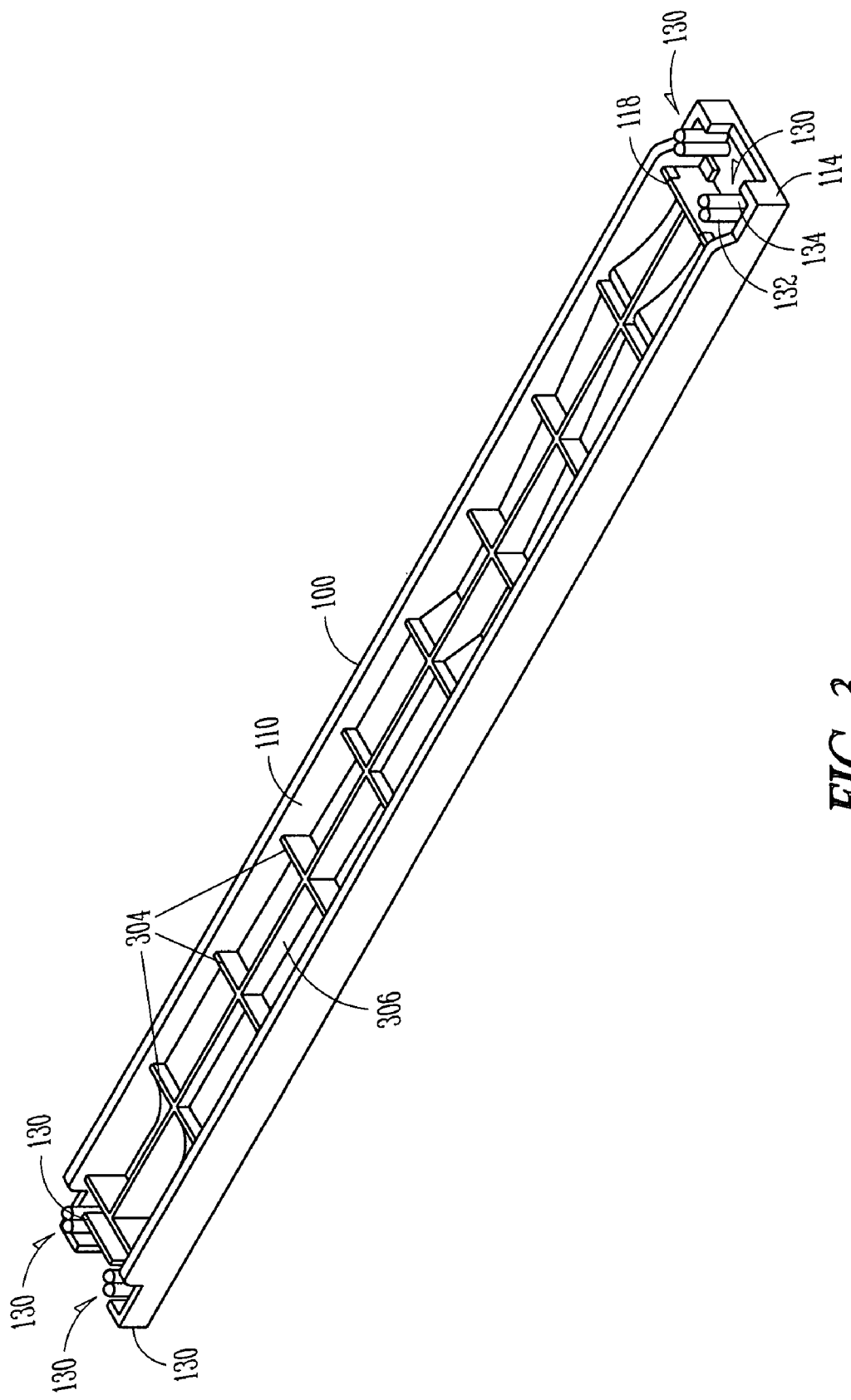
FIG. 3 shows a back perspective view of a blanking panel, in accordance with one embodiment.

Referring now also to FIG. 3, blanking panel 100 includes a main body 110 extending from a first end 112 to a second end 114. Each end 112, 114 of blanking panel 100 includes a fastener 116, and 118, respectively. The fasteners 116 and 118 engage with rack 150 to hold the blanking panel on the rack. For example, fasteners 116, 118 can include a clip structure located on each of the ends 112, 114 that engage an edge 152 of rack 150. (See also FIG. 6). The clip fasteners 116, 118 can include a main body portion extending from the main body 110 and a lip 119 (FIG. 6) on the end of the main body that extends over and engages edge 152 of rack 150.

Blanking panel 100 further includes one or more modifiable alignment members 130. Alignment members 130 utilize square holes 160 so as to guide and hold panel 100 in place when mounted on the rack 150. In this example, blanking panel 100 includes four modifiable alignment members 130, with a modifiable alignment member 130 in each corner of the substantially rectangular body 110, with two at the upper and lower portions of first end 112 and two at the upper and lower portion of second end 114. Each of these alignment members 130 includes a first pin 132 and a second pin 134. When mounted to a square holed rack, such as rack 150, the four second pins 134 abut the inner corners of square holes 160.

Figure 6:
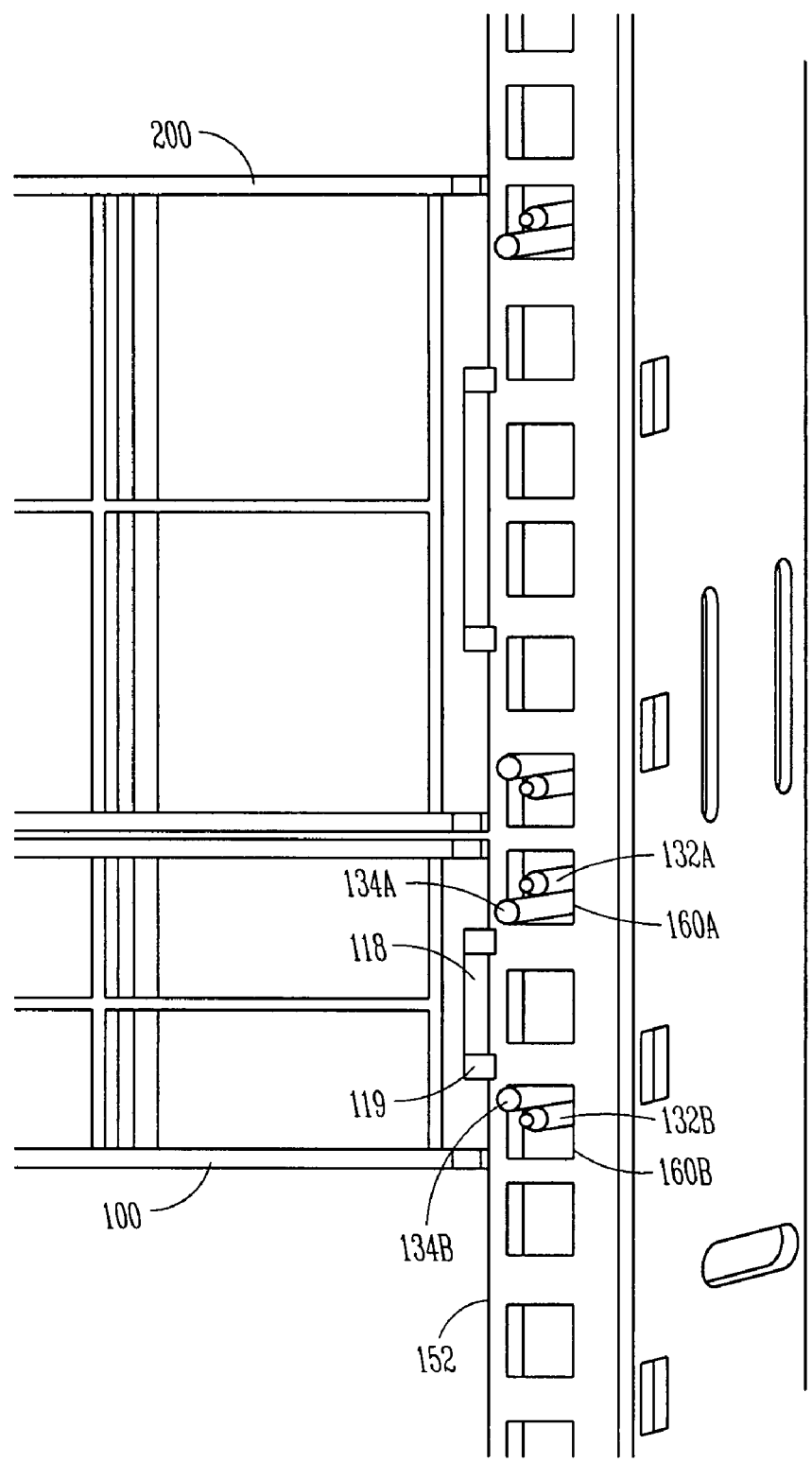
FIG. 6 shows a rear perspective view of blanking panels being mounted to a rack having square holes, in accordance with one embodiment.

For example, referring to FIG. 6, which shows a rear perspective view of blanking panel 100 being mounted to rack 150, a top pin 134A abuts a lower corner of square mounting hole 160A and a lower pin 134B abuts an upper corner of square mounting hole 160B. This keeps the blanking panel 100 in its mounted position on rack 150. First pins 132A and 132B extend through the center of square holes 160A and 160B, respectively, and play no part in holding the blanking panel in place.

Figure 2:
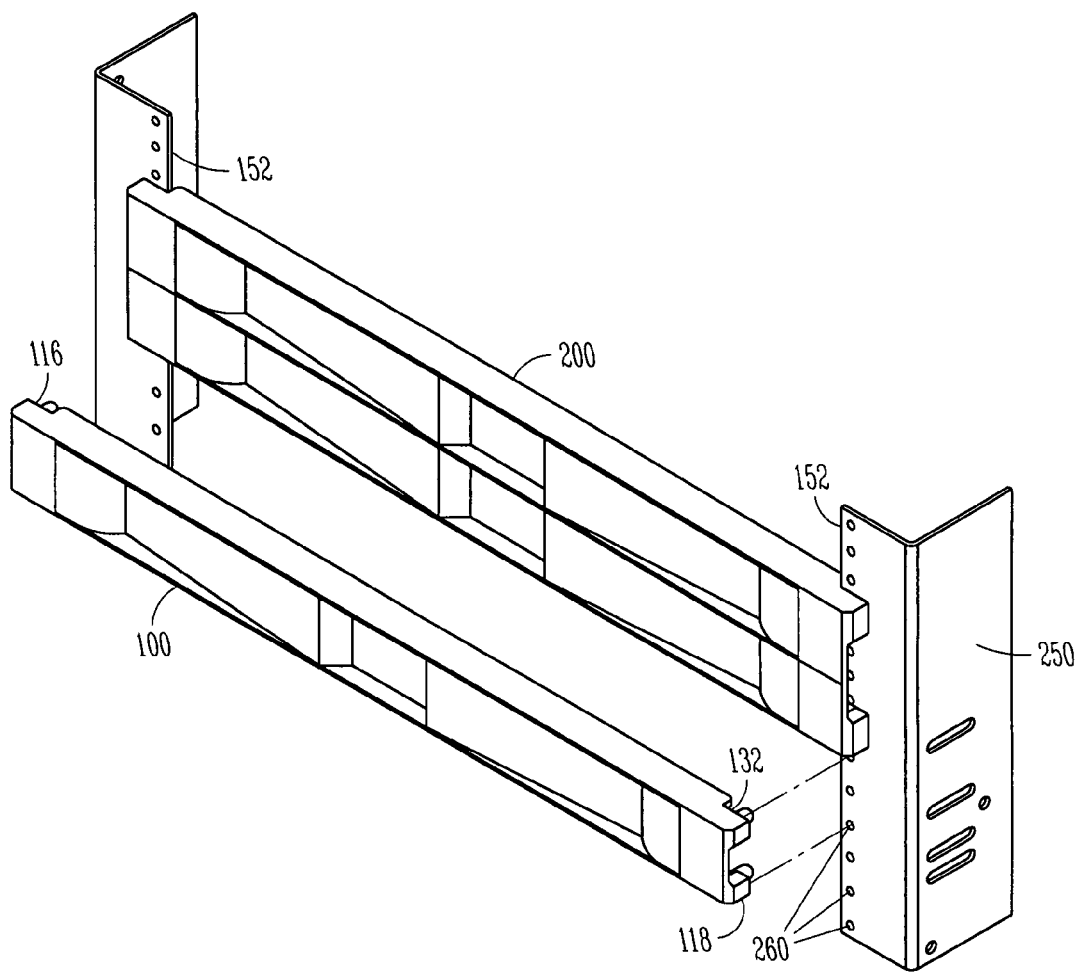
FIG. 2 shows a perspective view of blanking panels being mounted to a rack having round holes, in accordance with one embodiment.

FIG. 2 shows a perspective view of blanking panels 100 and 200 being mounted to a rack 250 having round holes 260. In this example, second pins 134 have been removed from the blanking panels. In this embodiment, fasteners 116, 118 still engage edges 152 of rack 250, but pins 134 are removed and pins 132 extend through holes 260 to align and hold the blanking panels in place.

FIG. 3 shows a back perspective view of blanking panel 100, in accordance with one embodiment. Blanking panel 100 has a substantially rectangular shape and includes one or more vertical struts 304 and one or more horizontal struts 306. Again, modifiable alignment members 130 are in each corner of the main body 110. Panels 100 and 200 can be formed of molded plastic.

Removable pins 134 allow the blanking panels 100, 200 to be used on either a square holed rack 150 or a tapped/untapped hole rack 250 with the simple filed modification of removing pins 134. The removable pin 134 can be cut or broken off by the user/installer such that the main body 110 can be alternatively attached to a square hole with the pin intact and acting as a guide, or attached to a tapped/untapped hole with the removable pin removed.

Figure 4:
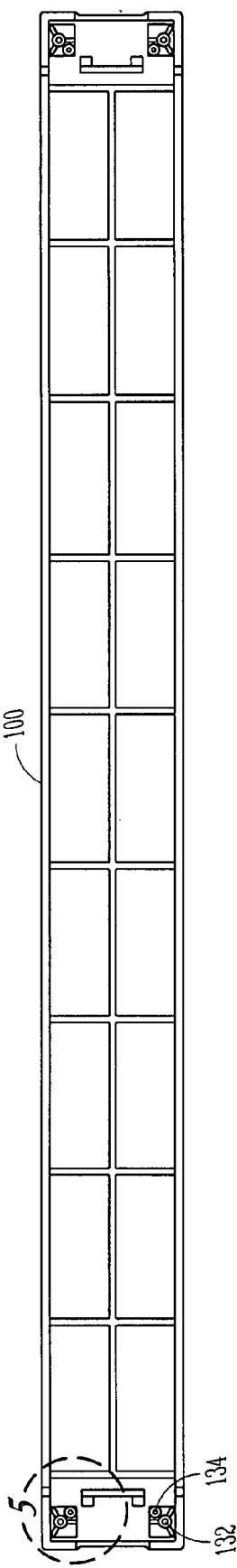
FIG. 4 shows a back view of a blanking panel in accordance with one embodiment.
Figure 5:
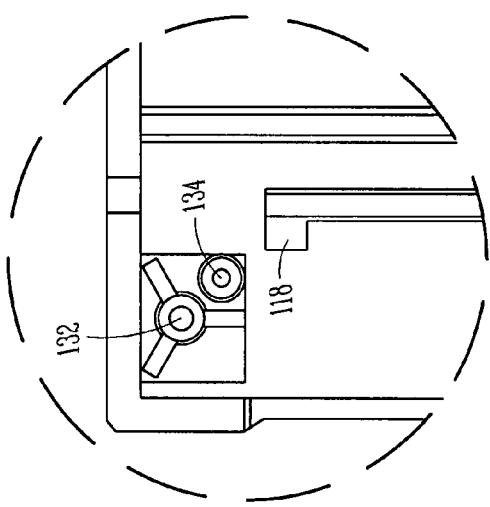
FIG. 5 shows a detail of the blanking panel of FIG. 4.

FIG. 4 shows a back view of blanking panel 100 in accordance with one embodiment. FIG. 5 shows a detail of blanking panel 100. In one embodiment, the main body 110 has a length of about 19 inches, with pins 132 being about 18.312 inches apart OC lengthwise, and 1.25 inches in depth apart OC. (For the 2 U, they are about 3.0 inches apart OC). Pins 132 can have a diameter of about 0.14 inches. Removable pins 134 are located about 45 degrees inward from each of the pins 132. For the 1 U example pins 132 are about 1.01 inches apart OC depthwise and about 18.073 inches apart lengthwise OC. (For the 2 U they are about 2.761 apart OC).

In use, if the blanking panel is being put onto a square holed rack the blanking panel is aligned and clipped into place, with clips engaging the edge of the rack and pins 132 aligning and holding the blanking panel in place. If the blanking panel is being used on a round hole rack, the pins 132 are removed and the clips are attached and the pins 134 align and extend through holes for aligning and holding the blanking panel in place.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A blanking panel comprising:
    a main body extending from a first end to a second end and adapted to cover a rack having at least two posts;
    a fastener portion at the end of each of the first and the second ends; and
    an alignment member at the end of each of the first end and the second end, the alignment member including a first pin and a second, removable pin such that the main body can be alternatively attached to a square hole with the removable pin intact, or attached to a round hole with the removable pin removed and the first pin extending through the hole;
    the main body including four alignment members, with one alignment member proximate each corner of the main body.

2. The blanking panel of claim 1, wherein the fastener portion includes a clip to clip over an edge of a post of the rack.

3. The blanking panel of claim 1, wherein the main body is about 19 inches in length to cover a 19 inch rack.

4. The blanking panel of claim 3, wherein the main body is dimensioned to have a 1 U size or a 2 U size.

5. The blanking panel of claim 1, wherein blanking panel is formed of molded plastic.

6. The blanking panel of claim 1, wherein the fastener includes a clip comprising a main portion extending from the main body and a lip to engage the edge of the rack.

7. A blanking panel comprising:
    a main body having a substantially rectangular shape having four corners and extending from a first end to a second end and adapted to cover a 19-inch rack having at least two vertical posts;
    a clip at the end of each of the first and the second ends to engage the vertical posts; and
    alignment members located proximate each of the four corners of the main body, each of the alignment members including a first pin and a second, removable pin such that the main body can be alternatively attached to a square hole with the removable pin intact to abut a corner of the square holes, or attached to a round hole with the removable pins removed and the first pin extending through the round hole.

8. The blanking panel of claim 7, wherein the clip includes a main portion extending from the main body and a lip to engage the edge of the rack.

9. The blanking panel of claim 7, wherein the main body is about 19 inches in length.

10. The blanking panel of claim 9, wherein the main body is dimensioned to have a 1 U size or a 2 U size.

11. The blanking panel of claim 7, wherein blanking panel is formed of molded plastic.

* * * * *